United States Patent
Hong et al.

(10) Patent No.: US 12,230,570 B2
(45) Date of Patent: Feb. 18, 2025

(54) INTEGRATED CIRCUIT WITH BURIED POWER RAIL AND METHODS OF MANUFACTURING THE SAME

(71) Applicant: Samsung Electronics Co., Ltd., Suwon-si (KR)

(72) Inventors: Joon Goo Hong, Austin, TX (US); Kang-ill Seo, Springfield, VA (US); Mark S. Rodder, Dallas, TX (US)

(73) Assignee: Samsung Electronics Co., Ltd., Yongin-si (KR)

( * ) Notice: Subject to any disclaimer, the term of this patent is extended or adjusted under 35 U.S.C. 154(b) by 287 days.

(21) Appl. No.: 17/574,073

(22) Filed: Jan. 12, 2022

(65) Prior Publication Data
US 2022/0139835 A1 May 5, 2022

Related U.S. Application Data

(62) Division of application No. 16/562,291, filed on Sep. 5, 2019, now Pat. No. 11,233,008.
(Continued)

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/76877* (2013.01); *H01L 23/53257* (2013.01); *H01L 29/0649* (2013.01)

(58) Field of Classification Search
CPC ........... H01L 23/5286; H01L 23/53257; H01L 23/535; H01L 23/5226; H01L 23/5283;
(Continued)

(56) References Cited

U.S. PATENT DOCUMENTS

| 4,802,062 A | 1/1989 | Blum et al. |
| 7,986,045 B2 | 7/2011 | Maebashi et al. |

(Continued)

FOREIGN PATENT DOCUMENTS

| CN | 106711120 A | 5/2017 |
| EP | 3 460 842 A1 | 3/2019 |

(Continued)

OTHER PUBLICATIONS

Taiwanese Office Action dated Aug. 23, 2023, issued in corresponding Taiwanese Patent Application No. 109112964 (7 pages).
(Continued)

*Primary Examiner* — Dao H Nguyen
(74) *Attorney, Agent, or Firm* — Lewis Roca Rothgerber Christie LLP

(57) ABSTRACT

A method of manufacturing an integrated circuit having buried power rails includes forming a first dielectric layer on an upper surface of a first semiconductor substrate, forming a series of power rail trenches in an upper surface of the first dielectric layer, forming the buried power rails in the series of power rail trenches, forming a second dielectric layer on the upper surface of the first dielectric layer and upper surfaces of the buried power rails, forming a third dielectric layer on a donor wafer, bonding the third dielectric layer to the second dielectric layer, and forming a series of semiconductor devices, vias, and metal interconnects on or in the donor wafer. The buried power rails are encapsulated by the first dielectric layer and the second dielectric layer, and the buried power rails are below the plurality of semiconductor devices.

16 Claims, 9 Drawing Sheets

Related U.S. Application Data

(60) Provisional application No. 62/863,606, filed on Jun. 19, 2019.

(51) Int. Cl.
  *H01L 23/532* (2006.01)
  *H01L 29/06* (2006.01)

(58) Field of Classification Search
  CPC ............. H01L 21/76877; H01L 21/743; H01L 21/76804; H01L 21/76879; H01L 21/02255; H01L 21/0226; H01L 21/76254; H01L 29/0649
  See application file for complete search history.

(56) References Cited

U.S. PATENT DOCUMENTS

| | | |
|---|---|---|
| 8,486,817 B2 | 7/2013 | Coudrain et al. |
| 8,551,878 B2 | 10/2013 | Sun-E et al. |
| 9,257,649 B2 | 2/2016 | Han |
| 9,570,395 B1 | 2/2017 | Sengupta et al. |
| 9,997,598 B2 | 6/2018 | Smith et al. |
| 10,074,570 B2 | 9/2018 | Anderson et al. |
| 10,921,515 B2 | 2/2021 | Nakashiba et al. |
| 11,631,667 B2 * | 4/2023 | Or-Bach ............. H01L 27/0688 257/347 |
| 11,676,945 B1 * | 6/2023 | Or-Bach ............. H01L 23/485 257/499 |
| 2003/0022483 A1 | 1/2003 | Shroff et al. |
| 2004/0155344 A1 | 8/2004 | Yamada et al. |
| 2010/0164119 A1 | 7/2010 | Takesako et al. |
| 2012/0256311 A1 | 10/2012 | Takeda et al. |
| 2012/0313176 A1 | 12/2012 | Frohberg et al. |
| 2017/0154970 A1 | 6/2017 | Burke et al. |
| 2017/0294448 A1 | 10/2017 | Debacker et al. |
| 2018/0128974 A1 * | 5/2018 | Iida ..................... H01L 27/1203 |
| 2018/0145030 A1 | 5/2018 | Beyne et al. |
| 2018/0190670 A1 | 7/2018 | Ryckaert et al. |
| 2018/0294267 A1 | 10/2018 | Licausi et al. |
| 2018/0374791 A1 | 12/2018 | Smith et al. |
| 2019/0006346 A1 * | 1/2019 | Chao ................... H01L 27/0688 |
| 2019/0057867 A1 | 2/2019 | Smith et al. |
| 2019/0080969 A1 | 3/2019 | Tsao |
| 2019/0237361 A1 | 8/2019 | Usami |

FOREIGN PATENT DOCUMENTS

| | | |
|---|---|---|
| JP | 2009-55007 A | 3/2009 |
| KR | 10-2010-0067576 A | 6/2010 |
| KR | 10-2011-0006135 A | 1/2011 |

OTHER PUBLICATIONS

Bharani Chava, et al., "Backside Power Delivery as a Scaling Knob for Future Systems", Proceedings vol. 10962, Design-Process-Technology Cooptimization for Manufacturability XIII; Mar. 20, 2019, 15 pgs., https://doi.org/10.1117/12.2514942, https://www.spiedigitallibrary.org/conference-proceedings-of-spie/10962/1096205/Backsidepower-delivery-as-a-scaling-knob-for-future-systems/10.1117/12.2514942.short?SSO=1.

Korean Office Action dated Aug. 11, 2024, issued in KR Patent Application No. 10-2020-0020399 (6 pages).

Chinese Office Action dated Aug. 14, 2024, issued in CN Patent Application No. 202010294764.1 (7 pages).

* cited by examiner

INTEGRATED CIRCUIT WITH BURIED POWER RAIL AND METHODS OF MANUFACTURING THE SAME

CROSS-REFERENCE TO RELATED APPLICATION(S)

This application is a divisional of U.S. patent application Ser. No. 16/562,291, filed Sep. 5, 2019, which claims priority to and the benefit of U.S. Provisional Application No. 62/863,606, filed Jun. 19, 2019, the entire contents of both of which are incorporated herein by reference.

BACKGROUND

1. Field

The present disclosure relates generally to integrated circuits having a buried power rail and methods of manufacturing the same.

2. Description of Related Art

Power is supplied to semiconductor chips by a power delivery network (PDN). The PDN includes a series of vias and conductors connected to VDD/VSS terminals of the chip for delivering power to the individuals devices (e.g., p-type field effect transistors (pFETs), n-type FETs (nFETS), inverters, NAND gates, NOR gates, flip flops, and/or other logic circuits) in the active devices.

In related art semiconductor chips, the PDN is connected to the individual active devices by a series of vias and interconnects in the back-end-of-line (BEOL) of the semiconductor chip above the active devices. For instance, in some related art semiconductor chips, the PDN is connected to metal line 2 (M2) or metal line 1 (M1) in the BEOL. However, as chip scaling increases to have high device density, the sizes of the active devices and the interconnects decrease, which creates congestion in the BEOL circuit interconnect design. This congestion in the BEOL circuit interconnect design may create reliability issues, such as due to electromigration (EM) and voltage (IR) drop.

SUMMARY

The present disclosure is directed to various embodiments of methods of manufacturing an integrated circuit having buried power rails. In one embodiment, the method includes forming a first dielectric layer on an upper surface of a first semiconductor substrate, forming a plurality of power rail trenches in an upper surface of the first dielectric layer, forming the buried power rails in the plurality of power rail trenches, forming a second dielectric layer on the upper surface of the first dielectric layer and upper surfaces of the buried power rails, forming a third dielectric layer on a donor wafer, bonding the third dielectric layer to the second dielectric layer, forming a series of semiconductor devices, vias, and metal interconnects on or in the donor wafer. The buried power rails are encapsulated by the first dielectric layer and the second dielectric layer, and the buried power rails are below the plurality of semiconductor devices.

Forming the first dielectric layer may include thermal oxidation of the upper surface of the first semiconductor substrate.

Forming the first dielectric layer may include depositing the first dielectric layer on the upper surface of the first semiconductor substrate.

Forming the buried power rails may include depositing a liner in each of the power rail trenches, depositing a conductive material on the liner in each of the power rail trenches, and performing chemical mechanical planarization.

The conductive material may have a thermal stability of at least approximately 700° C.

The method may also include annealing the second dielectric layer at a temperature of at least approximately 700° C.

The conductive material may be a refractive metal.

The refractive metal may be tungsten or ruthenium.

The first dielectric layer may be a thermal oxide layer having a thickness in a range from approximately 0.05 μm to approximately 9.8 μm, the second dielectric layer may be a deposited oxide layer having a thickness in a range from approximately 0.05 μm to approximately 0.1 μm, and the third dielectric layer may be a thermal oxide layer having a thickness in a range from approximately 0.05 μm to approximately 0.1 μm.

In one or more embodiments, the method of manufacturing an integrated circuit having buried power rails includes forming a first dielectric layer on an upper surface of a first semiconductor substrate, forming a conductive layer on an upper surface of the first dielectric layer, etching the conductive layer to form the buried power rails, forming a second dielectric layer on the upper surface of the first dielectric layer and around the buried power rails, forming a third dielectric layer on an upper surface of the second dielectric layer and upper surfaces of the buried power rails, forming a fourth dielectric layer on a donor wafer, bonding the fourth dielectric layer to the third dielectric layer, and forming a series of semiconductor devices, vias, and metal interconnects on or in the donor wafer. The buried power rails are encapsulated by the second dielectric layer and the third dielectric layer, and the buried power rails are below the semiconductor devices.

Forming the first dielectric layer may include thermal oxidation of the upper surface of the first semiconductor substrate.

Forming the first dielectric layer may include depositing the first dielectric layer on the upper surface of the first semiconductor substrate.

The method may also include depositing a liner on each of the buried power rails, and performing chemical mechanical planarization to remove the liner along an upper surface of each of the buried power rails.

The buried power rails may have a thermal stability of at least approximately 700° C.

The method may also include annealing the third dielectric layer at a temperature of at least approximately 700° C.

The conductive layer may be, or may include, a refractive metal.

The refractive metal may be tungsten or ruthenium.

The second dielectric layer may be a thermal oxide layer having a thickness in a range from approximately 0.05 μm to approximately 9.8 μm, the third dielectric layer may be a deposited oxide layer having a thickness in a range from approximately 0.05 μm to approximately 0.1 μm, and the fourth dielectric layer may be a thermal oxide layer having a thickness in a range from approximately 0.05 μm to approximately 0.1 μm.

The donor wafer may include silicon (Si), silicon-germanium (SiGe), Ge, a Group III-V material, or a combination thereof.

The donor wafer may have a thickness in a range from approximately 30 nm to approximately 10 μm.

The present disclosure is also directed to various embodiments of an integrated circuit. In one embodiment, the integrated circuit includes a first semiconductor substrate, a first dielectric layer on the first semiconductor substrate, buried power rails accommodated in the first dielectric layer, a second dielectric layer on the first dielectric layer and the buried power rails, and a series of active devices, vias, and metal interconnects on the second dielectric layer.

This summary is provided to introduce a selection of concepts that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will be better understood by reference to the following detailed description when considered in conjunction with the accompanying figures. In the figures, like reference numerals are used throughout the figures to reference like features and components. The figures are not necessarily drawn to scale.

DETAILED DESCRIPTION

Figure 1:
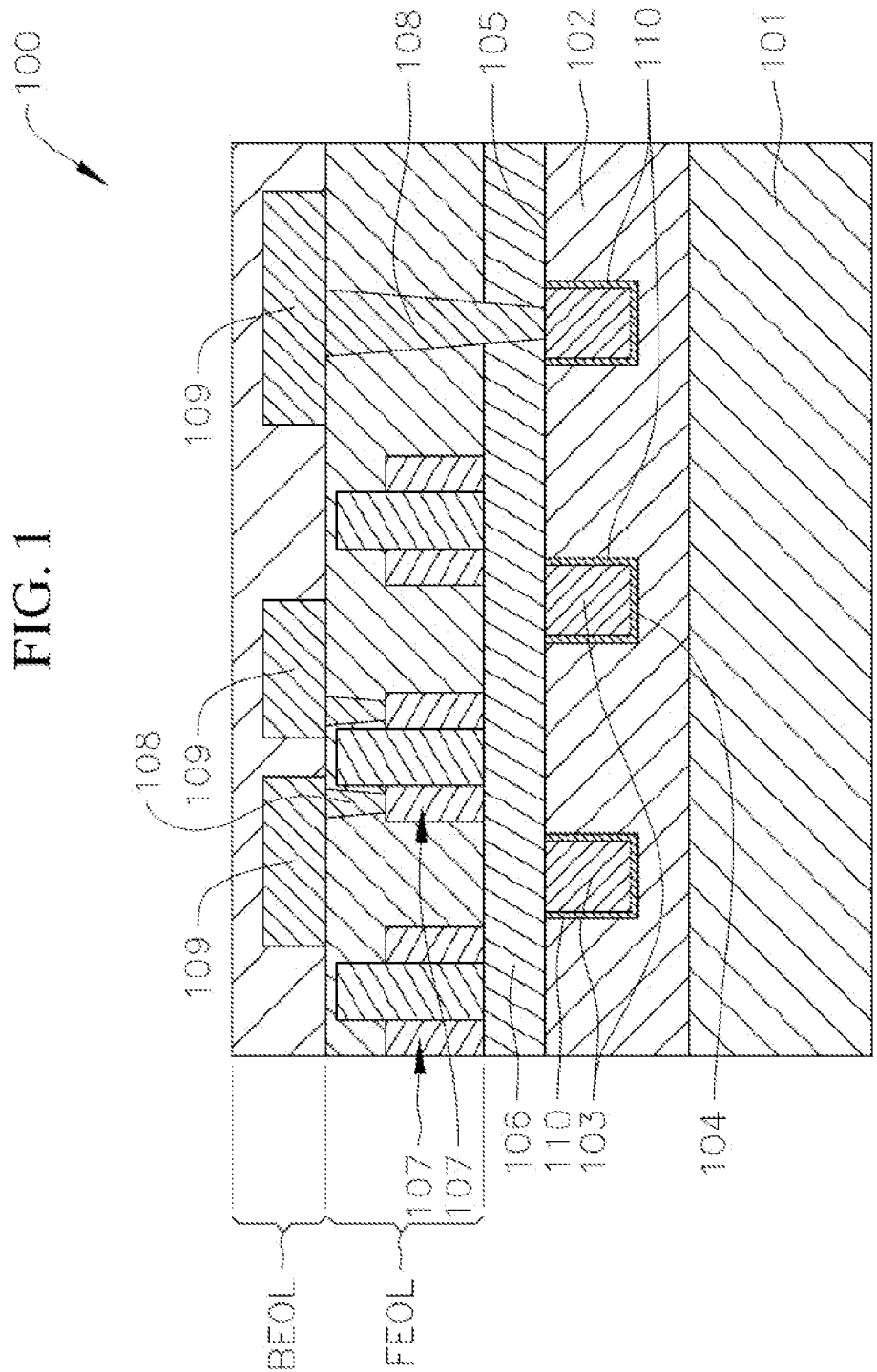
FIG. 1 is a side view of an integrated circuit including a buried power rail according to one embodiment of the present disclosure.

The present disclosure is directed to various embodiments of an integrated circuit having a buried power rail and various methods of manufacturing an integrated circuit having a buried power rail. The buried power rail of the integrated circuit according to various embodiments of the present disclosure is configured to free up routing space above the active devices (e.g., one or more p-type field effect transistors (pFETs), n-type FETs (nFETS), inverters, NAND gates, NOR gates, flip flops, and/or other logic circuits) in the integrated circuit and reduce the cell height of the integrated circuit compared to related art integrated circuits in which the power rails are above the active devices. Freeing up routing space above the active devices enables a relaxed metal pitch of the metal interconnects above the active devices, which may reduce the drop in electromigration (EM) and voltage (IR) that might otherwise occur in related art integrated circuits due to scaling of the integrated circuit.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of,"

when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

With reference now to FIG. 1, an integrated circuit 100 according to one embodiment of the present disclosure includes a first semiconductor substrate 101, a first dielectric layer 102 on the first semiconductor substrate 101, a series of buried power rails 103 in power rail trenches 104 extending downward toward the first semiconductor substrate 101 from an upper surface 105 of the first dielectric layer 102, a second dielectric layer 106 on the first dielectric layer 102 and the buried power rails 103, a series of active semiconductor devices 107 (e.g., one or more p-type field effect transistors (pFETs), n-type FETs (nFETS), inverters, NAND gates, NOR gates, flip flops, and/or other logic circuits) in the front-end-of-line (FEOL) of the integrated circuit 100, and a series of vias 108 and metal interconnects 109 in the back-end-of-line (BEOL). Additionally, in the illustrated embodiment, the integrated circuit 100 includes liners 110 in the power rail trenches 104 separating the buried power rails 103 from the first dielectric layer 102. The metal interconnects 109 and the vias 108 interconnect the semiconductor devices 107 and connect the semiconductor devices 107 to the buried power rails 103. In the illustrated embodiment, the buried power rails 103 are completely surrounded or encapsulated by dielectric material (e.g., the buried power rails 103 are completely surrounded or encapsulated by the first and second dielectric layers 102, 106).

In one or more embodiments, the first semiconductor substrate 101 may be a bare semiconductor wafer, such as a bare silicon (Si) wafer. In one or more embodiments, the first dielectric layer 102 may have a thickness in a range from approximately 0.1 μm to approximately 10 μm. In one or more embodiments, one or more of the vias 108 (e.g., the via 108 connecting one of the metal interconnects to one of the buried power rail) include a metal, such as, for example, ruthenium (Ru), tungsten (W), copper (Cu), cobalt (Co), or any other suitable metal.

The buried power rails 103 are configured to receive power from a power delivery network (PDN) and supply the power received from the PDN to the active semiconductor devices 107. In one or more embodiments, the PDN includes a series of vias and conductors connected to VDD/VSS terminals of the semiconductor chip into which the integrated circuit 100 is incorporated. Additionally, in the illustrated embodiment, the buried power rails 103 are below the active semiconductor devices 107, which frees up routing space above the active semiconductor devices 107 in the integrated circuit 100 (i.e., frees up routing space in the metal layers (M0, M1, M2, etc.) in the BEOL of the integrated circuit 100) and reduces the cell height of the integrated circuit 100 compared to related art integrated circuits in which the power rails are above the active semiconductor devices. Freeing up routing space above the active semiconductor devices 107 enables a relaxed metal pitch of the metal interconnects 109 above the active semiconductor devices 107, which may mitigate against a drop in electromigration (EM) and voltage (IR) that might otherwise occur in related art integrated circuits due to scaling of the integrated circuit.

In one or more embodiments, the buried power rails 103 may include any suitable metal, such as, for example, a refractive metal, such as tungsten (W) or ruthenium (Ru). In one or more embodiments, the buried power rails 103 may have a thermal stability greater than approximately 700° C., such as, for example, greater than approximately 800° C. or greater than approximately 900° C.

Figure 2:
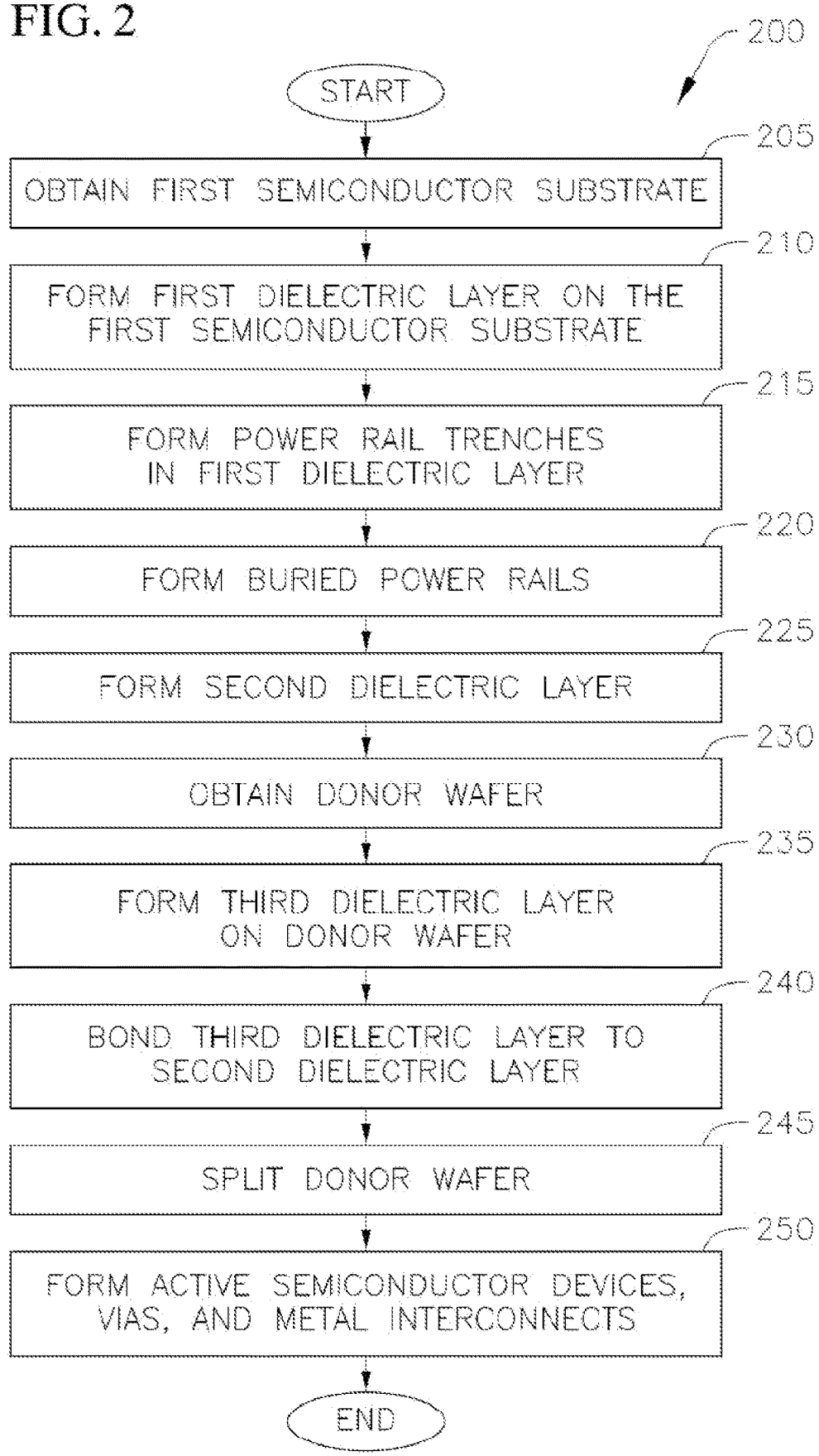
FIG. 2 is a flowchart illustrating tasks of a method of manufacturing an integrated circuit having a buried power rail according to one embodiment of the present disclosure.
Figure 3A:
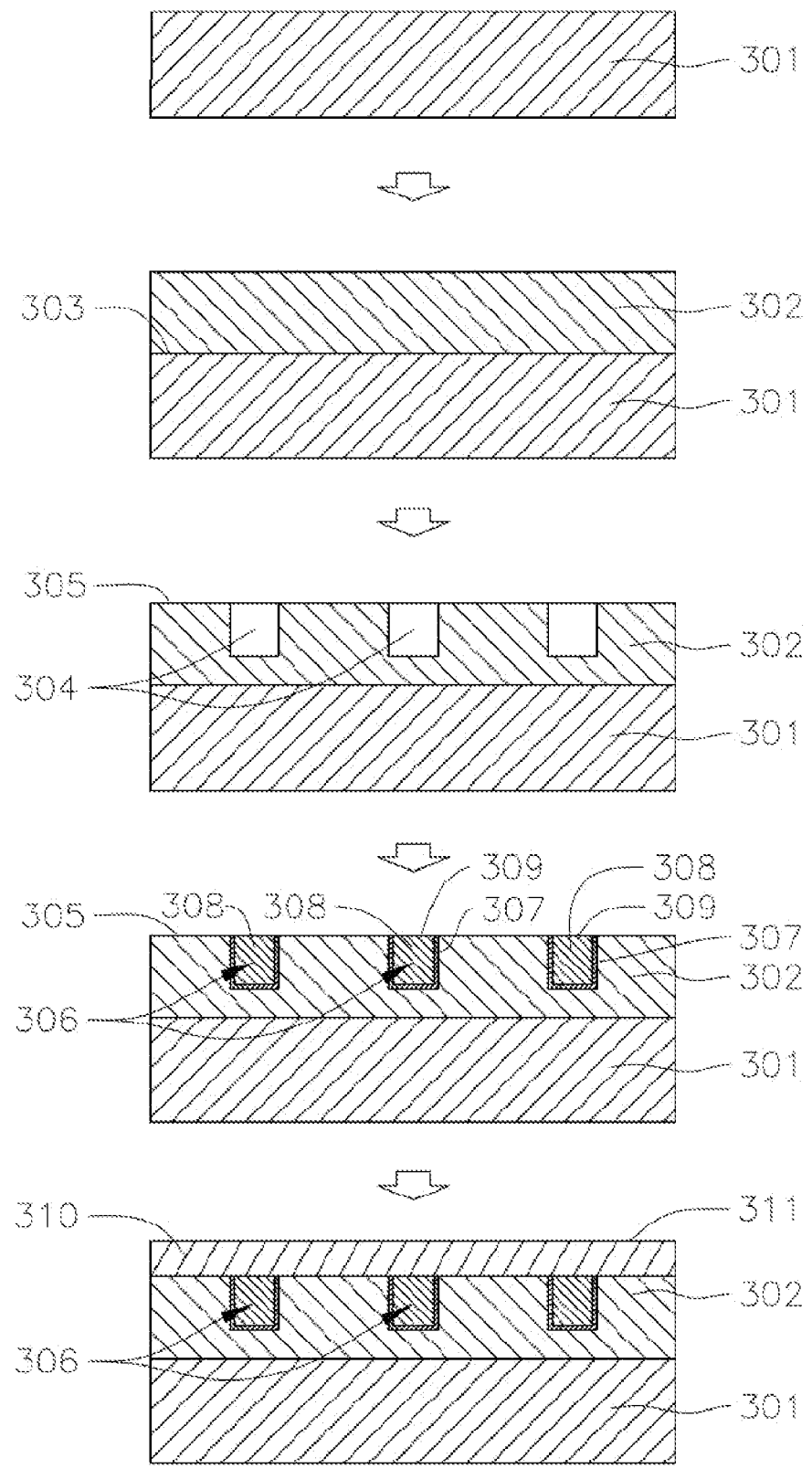
FIGS. 3A-3E depict tasks of manufacturing the integrated circuit having the buried power rail according to the embodiment in FIG. 2.

With reference now to FIGS. 2 and 3A, a method 200 of manufacturing an integrated circuit 300 having a buried power rail according to one embodiment of the present disclosure includes a task 205 of obtaining or manufacturing a first semiconductor substrate 301 (e.g., a bare semiconductor wafer, such as a bare silicon (Si) wafer).

In the illustrated embodiment, the method 200 also includes a task 210 of forming a first dielectric layer 302 on an upper surface 303 of the first semiconductor substrate 301. In one or more embodiments, the first dielectric layer 302 may be an oxide or any other suitable dielectric material. In one or more embodiments, the task 210 of forming the first dielectric layer 302 may including depositing the first dielectric layer 302 on the upper surface 303 of the bare first semiconductor substrate 301 or thermal oxidation of the upper surface 303 of the first semiconductor substrate 301. In one or more embodiments, the first dielectric layer 302 may have a thickness in a range from approximately 0.1 μm to approximately 10 μm.

In the illustrated embodiment, the method 200 also includes a task 215 of forming power rail trenches or recesses 304 in an upper surface 305 of the first dielectric layer 302 extending downward toward the first semiconductor substrate 301. In the illustrated embodiment, the method 200 also includes a task 220 of forming buried power rails 306 in the power rail trenches 304. In one or more embodiments, the task 220 of forming the buried power rails 306 includes a task of depositing a liner 307 in each of the power rail trenches 304, a task of depositing a conductive material 308 in each power rail trenches 304 and on the liner 307 in the respective power rail trench 304 (e.g., filling or substantially filling a remaining portion of the power rail trenches 304 with the conductive material 308 following the task of depositing the liner 307 in the power rail trenches 304), and a task of performing chemical mechanical planarization (CMP) along the upper surface 305 of the first dielectric layer 302, and along upper surfaces 309 of the buried power rails 306 (e.g., the liner 307 and the conductive material 308) deposited in each of the power rail trenches 304. In one or more embodiments, the liner 307 may be a thin seed material configured to promote formation of the conductive material 308. In one or more embodiments, the liner 307 may be TiNitride (TiN). In one or more embodiments, the task 220 of forming the buried power rails 306 in the power rail trenches 304 in the first dielectric layer 302 may be performed by one or more damascene processes. In one or more embodiments, the conductive material 308 deposited in task 220 may be any suitable metal, such as, for example, a refractive metal, such as tungsten (W) or ruthenium (Ru). In one or more embodiments, the conductive material 309 deposited in the power rail trenches 304 may have a thermal stability greater than approximately 700° C., such as, for example, greater than approximately 800° C. or greater than approximately 900° C.

In the illustrated embodiment, the method 200 also includes a task 225 of forming a second dielectric layer 310 on the upper surfaces 305 and 309 of the first dielectric layer 302 and the buried power rails 306 (e.g., the liner 307 and the conductive material 308) in the power rail trenches 304, respectively. Following the task 225 of forming the second dielectric layer 310, the buried power rails 306 (e.g., the liner 307 and the conductive material 308 in each of the power rail trenches 304) are completely surrounded or encapsulated by dielectric material (e.g., buried power rails 306 are completely surrounded or encapsulated by the first and second dielectric layers 302, 310). In one or more embodiments, the second dielectric layer 310 may be an oxide or any other suitable dielectric material. In one or more embodiments, the task 225 of forming the second dielectric layer 310 may including depositing the second dielectric layer 310 on the upper surfaces 305, 309 of the first dielectric layer 302 and the buried power rails 306, respectively, or thermal oxidation of the upper surfaces 305, 309 of the first dielectric layer 302 and the buried power rails 306, respectively. In one or more embodiments, the second dielectric layer 310 may have a thickness in a range from approximately 0.1 μm to approximately 10 μm. Additionally, in one or more embodiments, the task 225 of forming the second dielectric layer 310 may include performing CMP along an upper surface 311 of the second dielectric layer 310 and performing a high temperature anneal of the second dielectric layer 310. In one or more embodiments, the high temperature anneal of the second dielectric layer 310 may include annealing the second dielectric layer 310 at a temperature of approximately 700° C. or greater, such as greater than approximately 800° C. or greater than approximately 900° C.

Figure 3B:
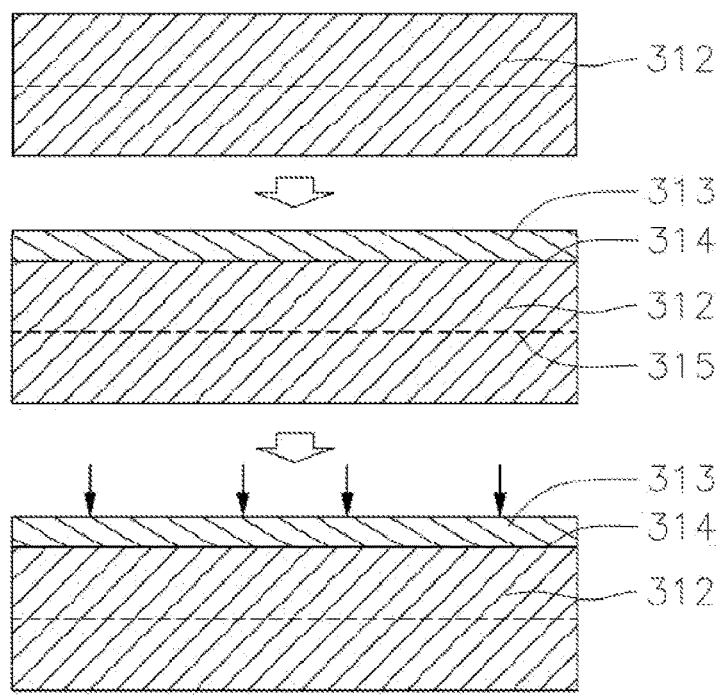

With reference now to the embodiment illustrated in FIGS. 2 and 3B, the method 200 also includes a task 230 of obtaining or manufacturing a donor wafer 312 (e.g., a bare semiconductor wafer, such as a bare silicon (Si) wafer). In one or more embodiments, the donor wafer 312 may include Si and/or silicon-germanium (SiGe), Ge, a Group III-V material, or similar materials. In one or more embodiments, the donor wafer 312 has a thickness in a range from approximately 30 nm (0.03 μm) to approximately 10 μm.

In the illustrated embodiment, the method 200 also includes a task 235 of forming a third dielectric layer 313 on an upper surface 314 of the donor wafer 312. In one or more embodiments, the third dielectric layer 313 may be an oxide or any other suitable dielectric material. In one or more embodiments, the task 235 of forming the third dielectric layer 313 may including depositing the third dielectric layer 313 on the upper surface 314 of the donor wafer 312 or oxidation of the upper surface 314 of the donor wafer 312 (e.g., the third dielectric layer 313 may be a deposited oxide or a thermal oxide). In one or more embodiments, the third dielectric layer 313 may have a thickness in a range from approximately 0.1 μm to approximately 10 μm.

In one or more embodiments, the first, second, and third dielectric layers 302, 310, 313 may be formed by the same process, may have the same or substantially the same thickness, and/or may be formed of the same material. In one or more embodiments, the first, second, and third dielectric layers 302, 310, 313 may be formed by two or more different processes, may have two or more different thicknesses, and/or may be formed of two or more different materials. For example, in one or more embodiments, the first dielectric layer 302 may be a thermal oxide have a thickness in a range from approximately 0.05 μm to approximately 9.8 μm, the second dielectric layer 310 may be a deposited oxide having a thickness in a range from approximately 0.05 μm to approximately 0.1 μm, and the third dielectric layer 313 may be a thermal oxide having a thickness in a range from approximately 0.05 μm to approximately 0.1 μm.

Figure 3C:
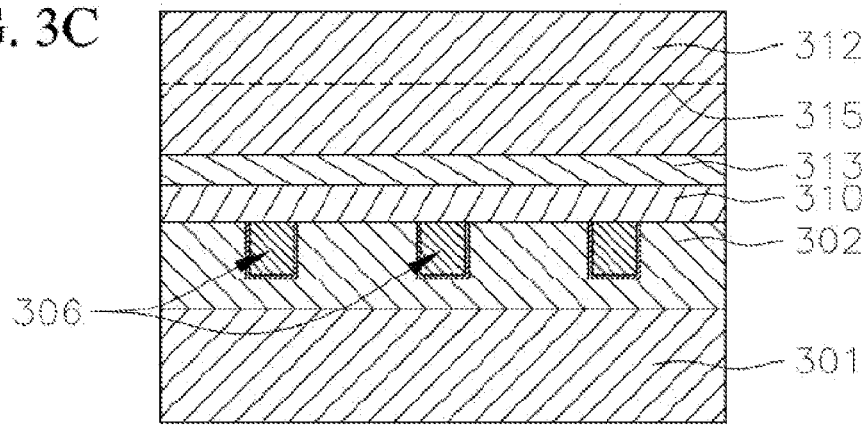

With reference now to FIGS. 2 and 3C, the method 200 also includes a task 240 of bonding the third dielectric layer 313 on the donor wafer 312 to the second dielectric layer 311 on the upper surfaces 305, 309 of the first dielectric layer 302 and the buried power rails 306 (e.g., the liner 307 and the conductive material 308) in the power rail trenches 304 in the first dielectric layer 302.

Figure 3D:
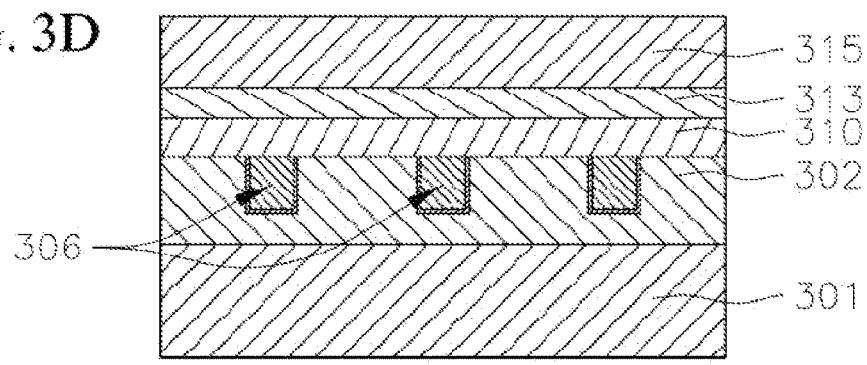

With reference now to FIGS. 2 and 3D, the method 200 also includes a task 245 of splitting the donor wafer 312. In one or more embodiments, the task 245 of splitting the donor wafer 312 may include polishing the donor wafer 312 to reduce the thickness of the donor wafer 312 to the desired thickness. In one or more embodiments, the donor wafer 312 may be pre-treated with a smart-cut 315 configured to enable de-bonding or separating the donor wafer 312 along the smart-cut 315, and the task 245 of splitting the donor wafer 312 may include de-bonding the donor wafer 312 by activating the smart-cut 315 in the donor wafer 312 to achieve the desired thickness of the donor wafer 312. The smart-cut 315 may be formed by any suitable manufacturing technique or process now known in the art or hereinafter developed. Smart-cuts are described in M. Bruel et al., "'Smart cut': a promising new SOI material technology," 1995 IEEE International SOI Conference Proceedings, Tucson, Arizona, USA, 1995, pp. 178-179, the entire contents of which are incorporated herein by reference. Additionally, in one or more embodiments in which the task 245 of splitting the donor wafer 312 is performed by activating the smart-cut 315 in the donor wafer 312, the donor wafer 312 may be hydrogen (H+) implanted before the task of activating the smart-cut 315. Furthermore, in one or more embodiments in which the task 245 of splitting the donor wafer 312 is performed by activating the smart-cut 315 in the donor wafer 312, the donor wafer 312 may be annealed and polished following the task of activating the smart-cut 315 in the donor wafer 312.

Figure 3E:
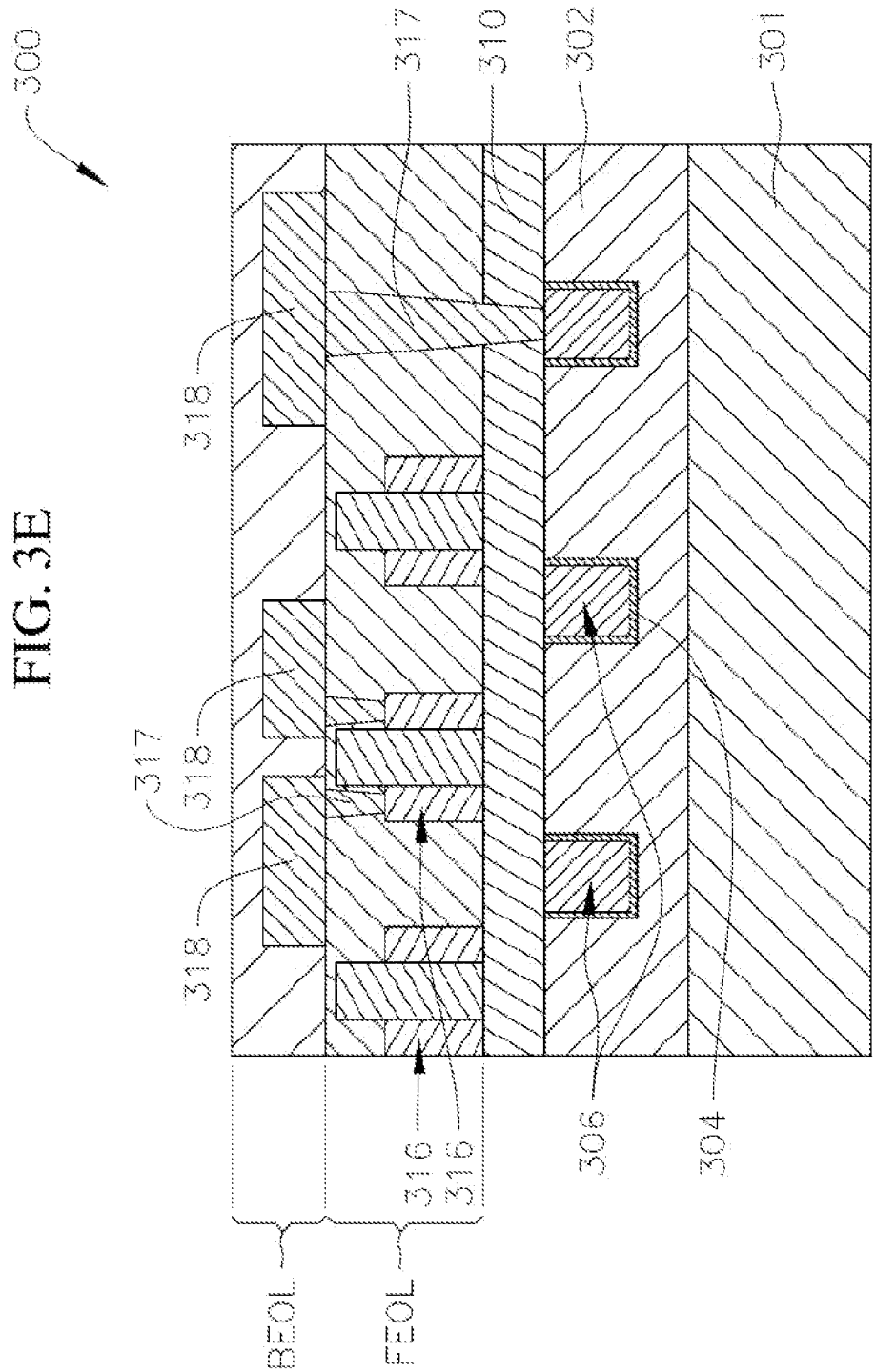

With reference now to FIGS. 2 and 3E, the method 200 includes one or more tasks 250 of forming active semiconductor devices 316 (e.g., one or more p-type field effect transistors (pFETs), n-type FETs (nFETS), inverters, NAND gates, NOR gates, flip flops, and/or other logic circuits) in the front-end-of-line (FEOL), vias 317, and metal interconnects 318 interconnecting the active semiconductor devices 316 and connecting the active semiconductor devices 316 to the buried power rails 306, in or on the donor wafer 312 to complete formation of the integrated circuit 300. In the illustrated embodiment, at least one of the vias 317 extends from one of the metal interconnects 318 to one of the active semiconductor devices 316, and at least one of the vias 317 extends from one of the buried power rails 306 (e.g., the liner 307 and conductive material 308 deposited in one of the power rail trenches 304 in the first dielectric layer 302) to one of the metal interconnects 318 such that power can be supplied from the buried power rails 306 (which receives power from a power delivery network (PDN) connected to VDD/VSS terminals of the chip into which the integrated circuit 300 is incorporated) to the active semiconductor devices 316. In one or more embodiments, the vias 317 (e.g., the via 317 connected to one of the buried power rails 306) includes a metal, such as, for example, ruthenium (Ru), tungsten (W), copper (Cu), cobalt (Co), or any other suitable metal.

Additionally, in the illustrated embodiment, the buried power rails 306 are below the active semiconductor devices 316, which frees up routing space above the active semiconductor devices 316 in the integrated circuit 300 (i.e., frees up routing space in the metal layers (M0, M1, M2, etc.) in the back-end-of-line (BEOL) of the integrated circuit 300) and reduces the cell height of the integrated circuit 300 compared to related art integrated circuits in which the power rails are above the active semiconductor devices. Freeing up routing space above the active semiconductor devices 316 enables a relaxed metal pitch of the metal interconnects 318 above the active semiconductor devices 316, which may reduce the drop in electromigration (EM) and voltage (IR) that might otherwise occur in related art integrated circuits due to scaling of the integrated circuit.

Figure 4:
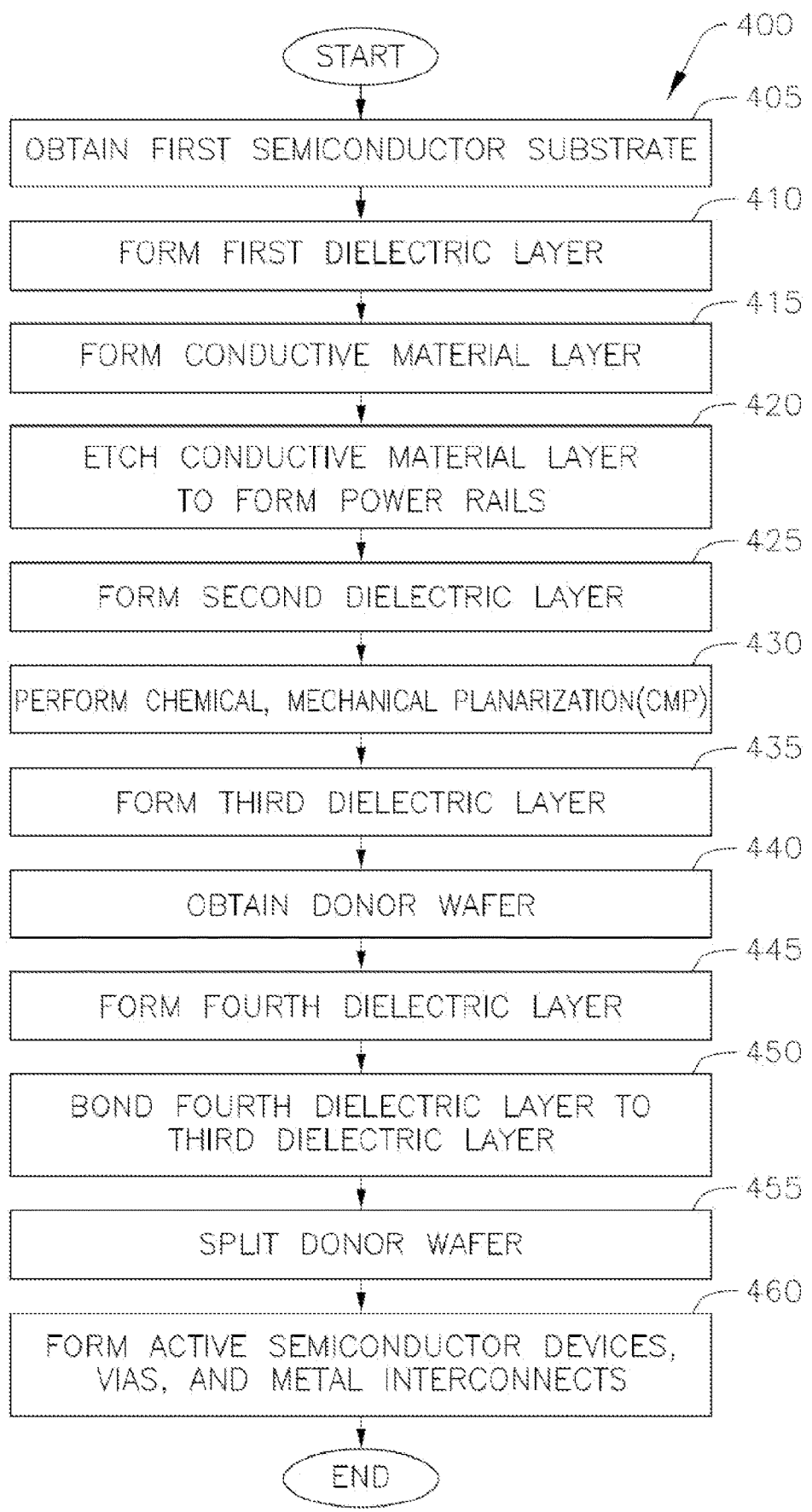
FIG. 4 is a flowchart illustrating tasks of a method of manufacturing an integrated circuit having a buried power rail according to another embodiment of the present disclosure.
Figure 5A:
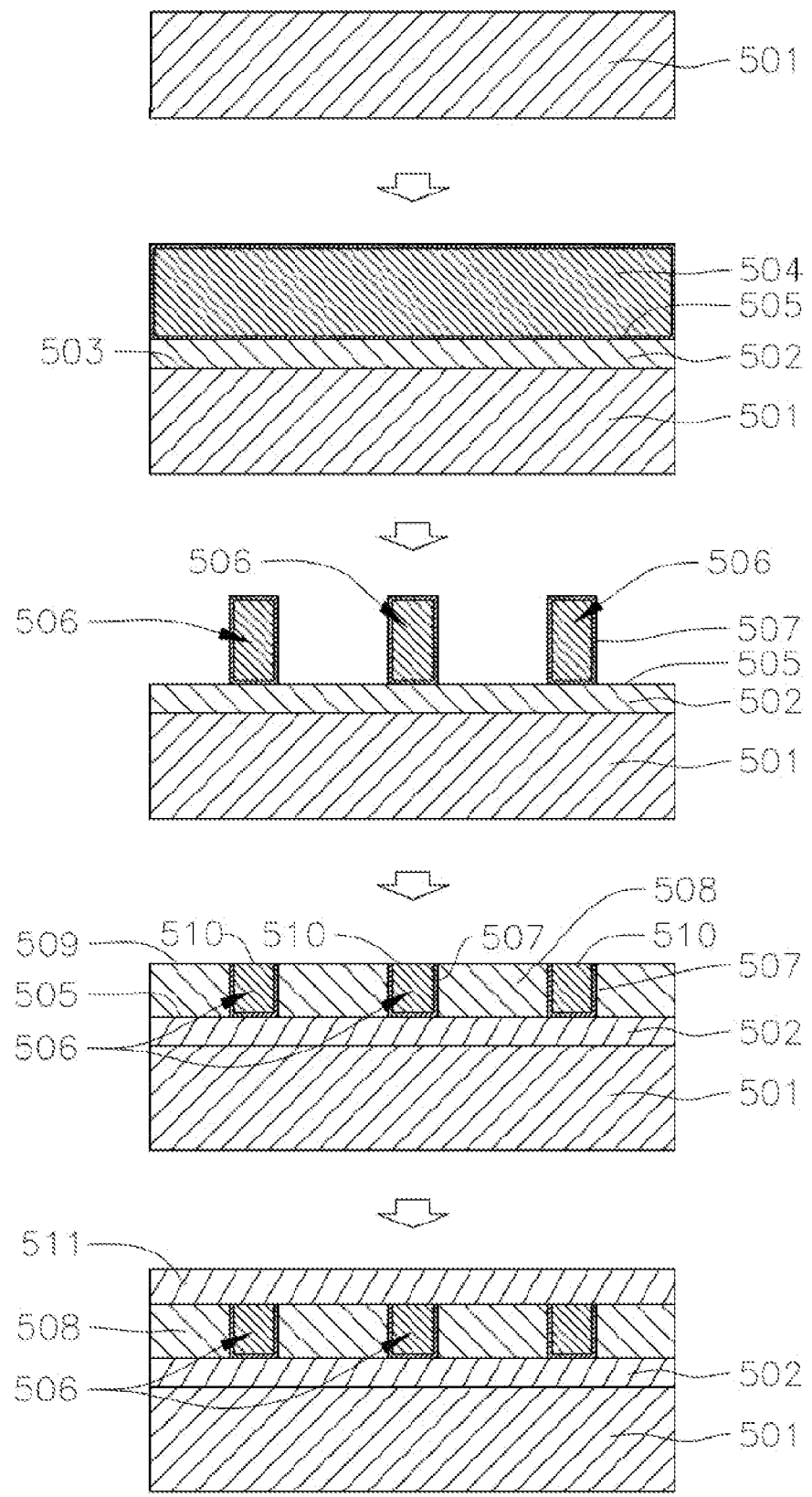
FIGS. 5A-5E depict tasks of manufacturing the integrated circuit having the buried power rail according to the embodiment in FIG. 4.

With reference now to FIGS. 4 and 5A, a method 400 of manufacturing an integrated circuit 500 having a buried power rail according to one embodiment of the present disclosure includes a task 405 of obtaining or manufacturing a first semiconductor substrate 501 (e.g., a bare semiconductor wafer, such as a bare silicon (Si) wafer).

In the illustrated embodiment, the method 400 also includes a task 410 of forming a first dielectric layer 502 on an upper surface 503 of the first semiconductor substrate 501. In one or more embodiments, the first dielectric layer 502 may be an oxide or any other suitable dielectric material. In one or more embodiments, the task 410 of forming the first dielectric layer 502 may including depositing the first dielectric layer 502 on the upper surface 503 of the first semiconductor substrate 501, or thermal oxidation of the upper surface 503 of the first semiconductor substrate 501. In one or more embodiments, the first dielectric layer 502 may have a thickness in a range from approximately 0.1 µm to approximately 10 µm.

In the illustrated embodiment, the method 400 also includes a task 415 of forming (e.g., depositing) a conductive material layer 504 on an upper surface 505 of the first dielectric layer 502. The conductive material of the conductive material layer 504 deposited in task 415 may be any suitable metal, such as, for example, a refractive metal, such as tungsten (W) or ruthenium (Ru). In one or more embodiments, the conductive material of the conductive material layer 504 deposited in task 415 may have a thermal stability greater than approximately 700° C., such as, for example, greater than approximately 800° C. or greater than approximately 900° C.

In the illustrated embodiment, the method 400 also includes a task 420 of etching the conductive material layer 504 to form power rails 506 (e.g., the remaining portions of the conductive material layer 504 not removed by the task 420 of etching the conductive material layer 504 form the power rails 506). In one or more embodiments, the task 420 of etching the conductive material layer 504 includes lithographic patterning of the conductive material layer 504 to define the configuration of the power rails 506, and subtractively etching (e.g., directly etching) the conductive material layer 504 to form the power rails 506. In the illustrated embodiment, the method 400 also includes a task 425 of forming (e.g., depositing) a thin barrier layer 507 around each of the power rails 506.

In the illustrated embodiment, the method 400 also includes a task 425 of forming (e.g., depositing) a second dielectric layer 508 on the upper surface 505 of the first dielectric layer 502 and around each of the power rails 506. In one or more embodiments, the method 400 also includes a task 430 of performing chemical mechanical planarization (CMP) along an upper surface 509 of the second dielectric layer 508, and along upper surfaces 510 of each of the power rails 506. In the illustrated embodiment, following the task 430 of performing CMP, the thin barrier layer 507 is removed along the upper surfaces 510 of the power rails 506 such that the upper surfaces 510 of the power rails 506 are exposed.

In the illustrated embodiment, the method 400 also includes a task 435 of forming (e.g., depositing) a third dielectric layer 511 on the upper surfaces 509, 510 of the second dielectric layer 508 and each of the power rails 506. Following the task 435 of forming the third dielectric layer 511, the power rails 506 (e.g., the portions of conductive material layer 504 remaining following the task 420 of etching the conductive material layer 504) are completely surrounded or encapsulated by dielectric material (e.g., power rails 506 are completely surrounded or encapsulated by the first, second, and third dielectric layers 502, 508, 511). In one or more embodiments, the third dielectric layer 511 may be an oxide or any other suitable dielectric material. In one or more embodiments, the task 435 of forming the third dielectric layer 511 may including depositing the third dielectric layer 511 on the upper surfaces 509, 510 of the second dielectric layer 508 and the power rails 506, or thermal oxidation of the upper surfaces 509, 510 of the second dielectric layer 508 and the power rails 506. In one or more embodiments, the third dielectric layer 511 may have a thickness in a range from approximately 0.1 µm to approximately 10 µm. Additionally, in one or more embodiments, the task 435 of forming the third dielectric layer 511 may include performing CMP along an upper surface 512 of the third dielectric layer 511 and performing a high temperature anneal of the third dielectric layer 511. In one or more embodiments, the high temperature anneal of the third dielectric layer 511 may include annealing the third dielectric layer 511 at a temperature of approximately 700° C. or greater, such as greater than approximately 800° C. or greater than approximately 900° C.

Figure 5B:
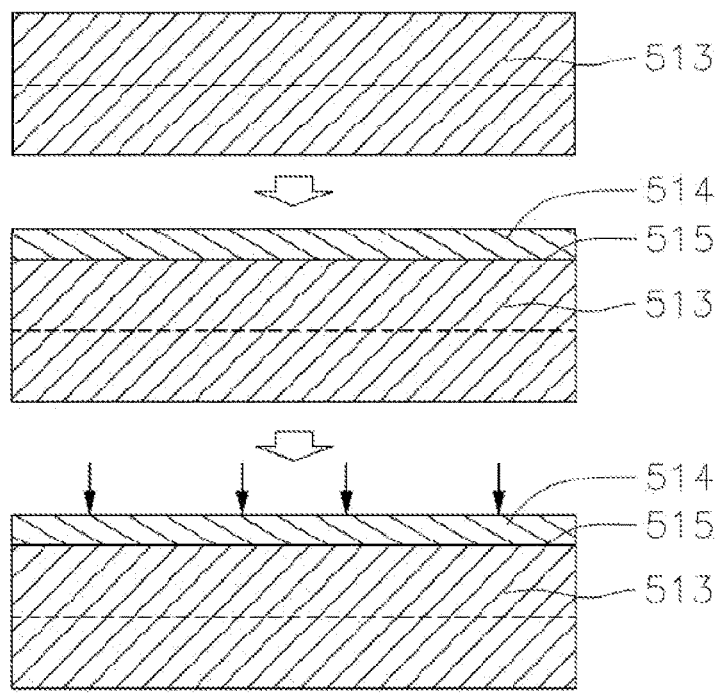

With reference now to the embodiment illustrated in FIGS. 4 and 5B, the method 400 also includes a task 440 of obtaining or manufacturing a donor wafer 513 (e.g., a bare semiconductor wafer, such as a bare silicon (Si) wafer). In one or more embodiments, the donor wafer 513 may include Si and/or silicon-germanium (SiGe), Ge, a Group III-V material, or similar materials. In one or more embodiments, the donor wafer 513 has a thickness in a range from approximately 30 nm (0.03 µm) to approximately 10 µm.

In the illustrated embodiment, the method 400 also includes a task 445 of forming (e.g., depositing) a fourth dielectric layer 514 on an upper surface 515 of the donor wafer 513. In one or more embodiments, the fourth dielectric layer 514 may be an oxide or any other suitable dielectric material. In one or more embodiments, the task 445 of forming the fourth dielectric layer 514 may including depositing the fourth dielectric layer 514 on the upper surface 515 of the donor wafer 513, or thermal oxidation of the upper surface 515 of the donor wafer 513 (e.g., the fourth dielectric layer 514 may be a deposited oxide or a thermal oxide). In one or more embodiments, the fourth dielectric layer 514 may have a thickness in a range from approximately 0.1 μm to approximately 10 μm.

In one or more embodiments, the first, second, third, and fourth dielectric layers 502, 508, 511, 514 may be formed by the same process, may have the same or substantially the same thicknesses, and/or may be formed of the same material. In one or more embodiments, the first, second, third, and fourth dielectric layers 502, 508, 511, 514 may be formed by two or more different processes, may have two or more different thicknesses, and/or may be formed of two or more different materials. For example, in one or more embodiments, the second dielectric layer 508 may be a thermal oxide have a thickness in a range from approximately 0.05 μm to approximately 9.8 μm, the third dielectric layer 511 may be a deposited oxide having a thickness in a range from approximately 0.05 μm to approximately 0.1 μm, and the fourth dielectric layer 514 may be a thermal oxide having a thickness in a range from approximately 0.05 μm to approximately 0.1 μm.

Figure 5C:
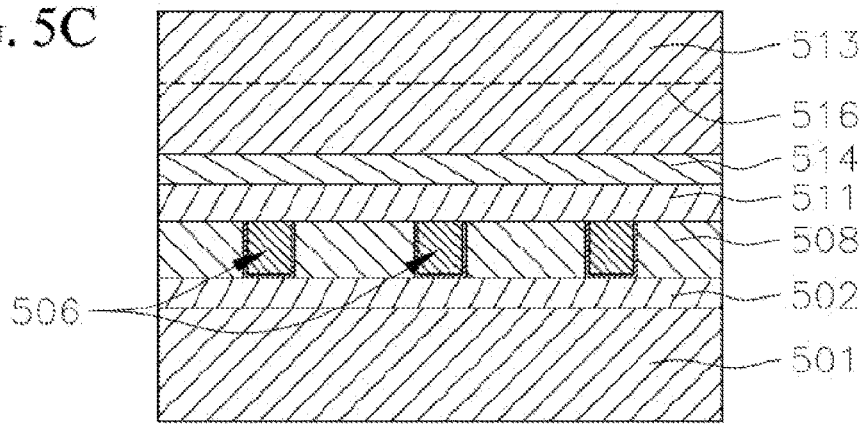

With reference now to FIGS. 4 and 5C, the method 400 also includes a task 450 of bonding the fourth dielectric layer 514 on the donor wafer 513 to the third dielectric layer 508 on the upper surfaces 509, 510 of the second dielectric layer 508 and each of the power rails 506.

Figure 5D:
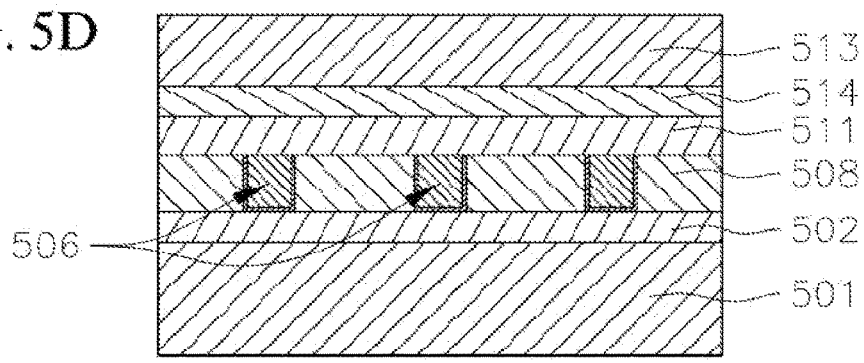

With reference now to FIGS. 4 and 5D, the method 400 also includes a task 455 of splitting the donor wafer 513. In one or more embodiments, the task 455 of splitting the donor wafer 513 may include polishing the donor wafer 513 to reduce the thickness of the donor wafer 513 to the desired thickness. In one or more embodiments, the donor wafer 513 may be pre-treated with a smart-cut 516 configured to enable de-bonding or separating the donor wafer 513 along the smart-cut 516, and the task 455 of splitting the donor wafer 513 may include de-bonding the donor wafer 513 by activating the smart-cut 516 in the donor wafer 513 to achieve the desired thickness of the donor wafer 513. The smart-cut 516 may be formed by any suitable manufacturing technique or process now known in the art or hereinafter developed, such as by the technique(s) or process(es) described in M. Bruel et al., "'Smart cut': a promising new SOI material technology," 1995 IEEE International SOI Conference Proceedings, Tucson, Arizona, USA, 1995, pp. 178-179. Additionally, in one or more embodiments in which the task 455 of splitting the donor wafer 513 is performed by activating the smart-cut 516 in the donor wafer 513, the donor wafer 513 may be hydrogen (H+) implanted before the task of activating the smart-cut 516. Furthermore, in one or more embodiments in which the task 455 of splitting the donor wafer 513 is performed by activating the smart-cut 516 in the donor wafer 513, the donor wafer 513 may be annealed and polished following the task of activating the smart-cut 516 in the donor wafer 513.

Figure 5E:
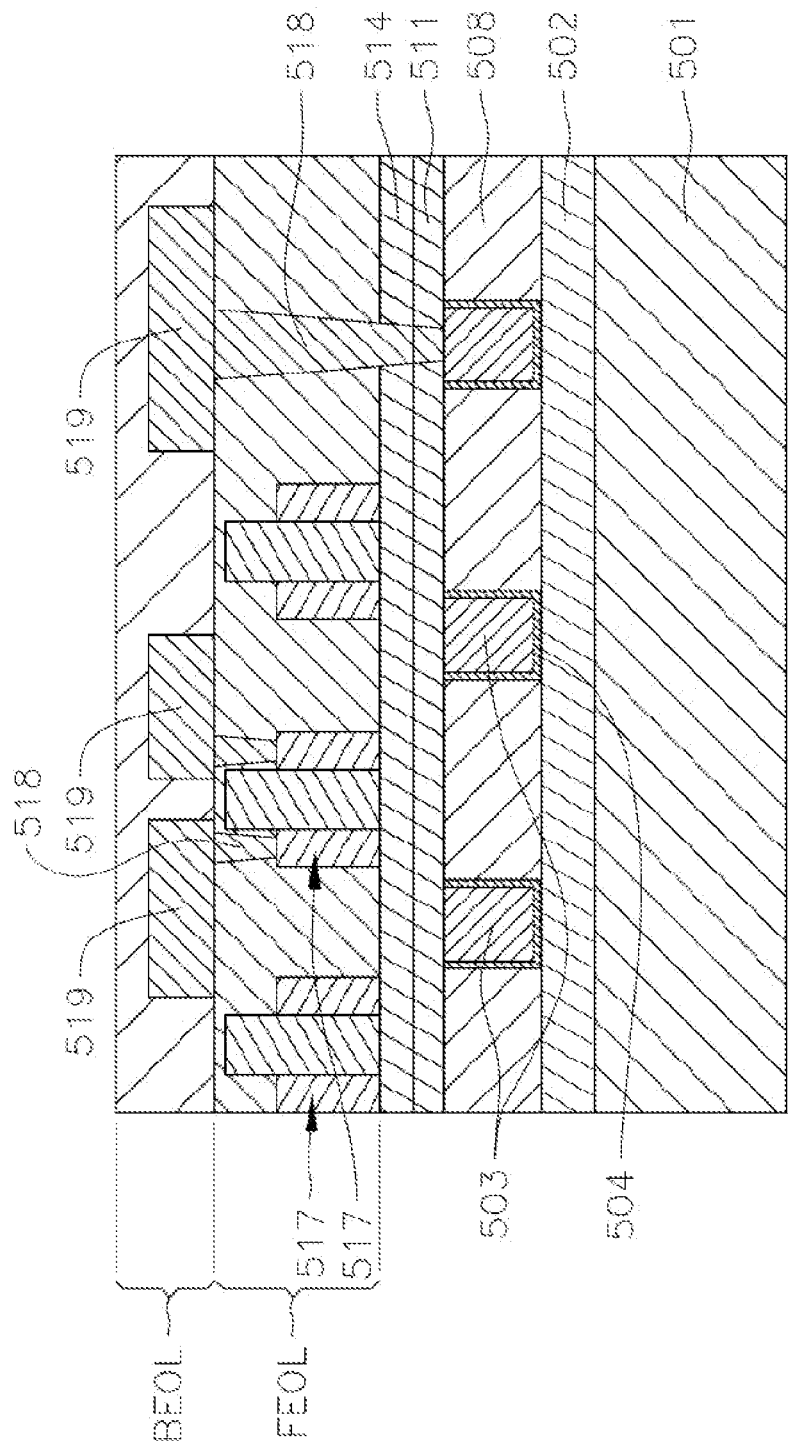

With reference now to FIGS. 4 and 5E, the method 400 includes one or more tasks 460 of forming active semiconductor devices 517 (e.g., one or more p-type field effect transistors (pFETs), n-type FETs (nFETS), inverters, NAND gates, NOR gates, flip flops, and/or other logic circuits) in the front-end-of-line (FEOL), vias 518, and metal interconnects 519 interconnecting the active semiconductor devices 517 and connecting the active semiconductor devices 517 to the buried power rails 506, in or on the donor wafer 513 to complete formation of the integrated circuit 500. In the illustrated embodiment, at least one of the vias 518 extends from one of the metal interconnects 519 to one of the active semiconductor devices 517, and at least one of the vias 518 extends from one of the buried power rails 506 (e.g., one of the portions of conductive material layer 504 remaining following the task 420 of etching the conductive material layer 504) to one of the metal interconnects 519 such that power can be supplied from the buried power rails 506 (which receives power from a power delivery network (PDN) connected to VDD/VSS terminals of the chip into which the integrated circuit 500 is incorporated) to the active semiconductor devices 517. In one or more embodiments, the vias 518 (e.g., the via 518 connected to one of the buried power rails 506) includes a metal, such as, for example, ruthenium (Ru), tungsten (W), copper (Cu), cobalt (Co), or any other suitable metal.

Additionally, in the illustrated embodiment, the buried power rails 506 are below the active semiconductor devices 517, which frees up routing space above the active semiconductor devices 517 in the integrated circuit 500 (i.e., frees up routing space in the metal layers (M0, M1, M2, etc.) in the back-end-of-line (BEOL) of the integrated circuit 500) and reduces the cell height of the integrated circuit 500 compared to related art integrated circuits in which the power rails are above the active semiconductor devices. Freeing up routing space above the active semiconductor devices 517 enables a relaxed metal pitch of the metal interconnects 519 above the active semiconductor devices 517, which may reduce the drop in electromigration (EM) and voltage (IR) that might otherwise occur in related art integrated circuits due to scaling of the integrated circuit.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. An integrated circuit comprising:
   a first semiconductor substrate, the first semiconductor substrate being a bare semiconductor wafer;
   a first dielectric layer on the first semiconductor substrate;
   buried power rails accommodated in the first dielectric layer;
   a second dielectric layer on the first dielectric layer and the buried power rails;
   a third dielectric layer on the second dielectric layer;
   a donor wafer on the third dielectric layer; and
   a plurality of active devices, vias, and metal interconnects on or in the donor wafer.

2. The integrated circuit of claim 1, wherein at least one of the first dielectric layer, the second dielectric layer, and the third dielectric layer is a thermal oxide layer having a thickness in a range from approximately 0.1 μm to approximately 10 μm.

3. The integrated circuit of claim 1, wherein:
   the first dielectric layer is a thermal oxide layer having a thickness in a range from approximately 0.05 μm to approximately 9.8 μm,
   the second dielectric layer is a thermal oxide layer having a thickness in a range from approximately 0.05 μm to approximately 0.1 μm, and
   the third dielectric layer is a thermal oxide layer having a thickness in a range from approximately 0.05 μm to approximately 0.1 μm.

4. The integrated circuit of claim 1, wherein the active devices are in the third dielectric layer and the metal interconnects are in the donor wafer.

5. The integrated circuit of claim 1, wherein the donor wafer comprises a material selected from the group consisting of silicon (Si), silicon-germanium (SiGe), Ge, a Group III-V material, and combinations thereof.

6. The integrated circuit of claim 1, wherein the donor wafer has a thickness in a range from approximately 30 nm to approximately 10 µm.

7. The integrated circuit of claim 1, wherein the buried power rails have a thermal stability of at least approximately 700° C.

8. The integrated circuit of claim 1, wherein the buried power rails comprise a refractive metal.

9. The integrated circuit of claim 8, wherein the refractive metal is tungsten or ruthenium.

10. The integrated circuit of claim 1, further comprising a liner between the buried power rails and the first dielectric layer.

11. The integrated circuit of claim 10, wherein the liner comprises titanium nitride (TiN).

12. The integrated circuit of claim 1, wherein the first dielectric layer is directly on the first semiconductor substrate.

13. The integrated circuit of claim 12, wherein the buried power rails are accommodated in trenches in an upper surface of the first dielectric layer.

14. The integrated circuit of claim 1, wherein the first dielectric layer is separated from the first semiconductor substrate by another dielectric layer.

15. The integrated circuit of claim 14, further comprising a liner separating the buried power rails from the first dielectric layer and the another dielectric layer.

16. The integrated circuit of claim 15, further comprising a fourth dielectric layer on the third dielectric layer, wherein the donor wafer is on the fourth dielectric layer, and wherein the active devices are in the fourth dielectric layer.

* * * * *